(12) United States Patent
Jau et al.

(10) Patent No.: US 7,656,211 B2
(45) Date of Patent: Feb. 2, 2010

(54) DYNAMIC FLOATING INPUT D FLIP-FLOP

(75) Inventors: Ting-Sheng Jau, Taipei (TW); Wei-Bin Yang, Taichung County (TW); Yu-Lung Lo, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 90 days.

(21) Appl. No.: 11/615,000

(22) Filed: Dec. 22, 2006

(65) Prior Publication Data

US 2008/0106315 A1    May 8, 2008

(30) Foreign Application Priority Data

Oct. 30, 2006    (TW)    ............... 95139968 A

(51) Int. Cl.
*H03K 3/00*    (2006.01)
(52) U.S. Cl. ............... 327/218; 327/214; 327/215; 327/216; 327/217; 327/219
(58) Field of Classification Search .............. 327/218
See application file for complete search history.

(56) References Cited

U.S. PATENT DOCUMENTS

| 4,933,571 | A | * | 6/1990 | Pribyl ................. 327/210 |
| 5,898,330 | A | | 4/1999 | Klass |
| 5,917,355 | A | * | 6/1999 | Klass ................. 327/208 |
| 5,930,322 | A | | 7/1999 | Yang et al. |
| 6,094,466 | A | | 7/2000 | Yang et al. |
| 6,275,083 | B1 | * | 8/2001 | Martinez et al. ........... 327/218 |
| 6,448,831 | B1 | * | 9/2002 | Hunt et al. ............... 327/211 |
| 2003/0210085 | A1 | | 11/2003 | Larsson et al. |
| 2004/0075480 | A1 | * | 4/2004 | Ahn ..................... 327/218 |
| 2006/0170461 | A1 | * | 8/2006 | Bhattacharya et al. ........ 327/65 |

OTHER PUBLICATIONS

J. Navarro Soares, Jr. et al., "A 1.6-GHz Dual Modulus Prescaler Using the Extended True-Single-Phase-Clock CMOS Circuit Technique (E-TSPC)", IEEE Journal of Solid-State Circuit, vol. 34, No. 1, Jan. 1999.

(Continued)

*Primary Examiner*—Lincoln Donovan
*Assistant Examiner*—John W Poos
(74) *Attorney, Agent, or Firm*—Jianq Chyun IP Office

(57) ABSTRACT

A dynamic floating input D flip-flop (DFIDFF) is provided. The DFIDFF includes a floating input stage, a first string of transistors, and a second string of transistors. At a pre-charge period, the floating input stage transmits the input data to the first string of transistors; the first string of transistors stores the logic status of the input data, and pre-charges its output node to a first level. At an evaluation period, the first string of transistors decides its output node level in accordance with data logic status stored in the first string of transistors; and the second string of transistors decides output level of the D flip-flop in accordance with logic status of the output node of the first string of transistors.

27 Claims, 12 Drawing Sheets

OTHER PUBLICATIONS

Joao Navarro, S., Jr. et al., "Extended TSPC Structures With Double Input/Output Data Throughput for Gigahertz CMOS Circuit Design", IEEE Transactions on Very Scale Integration (VLSI) Systems vol. 10, No. 3, Jun. 2002.

J. Yuan and C. Svensson, "A True Single-Phase-Clock Dynamic CMOS Circuit Technique" IEEE J. Solid-State Circuit, vol. sc-22, No. 5, Oct. 1987.

J. Yuan and C. Svensson, "New Single-Clock CMOS Latches and Flipflops with Improved Speed and Power Savings" IEEE J. Solid-State Circuit, vol. 32, pp. 62-69, Jan. 1997.

Ching-Yuan Yang, Guang-Kaai Dehng, June-Ming Hsu and Shen-Iuan Liu, "New Dynamic Flip-Flops for High-Speed Dual-Modulus Prescaler" IEEE J. Solid-State Circuit, vol. 33, No. 10, Oct. 1998.

* cited by examiner

DYNAMIC FLOATING INPUT D FLIP-FLOP

CROSS-REFERENCE TO RELATED APPLICATION

This application claims the priority benefit of Taiwan application serial no. 95139968, filed Oct. 30, 2006. All disclosure of the Taiwan application is incorporated herein by reference.

BACKGROUND OF THE INVENTION

1. Field of Invention

The present invention relates to a D flip-flop. More particularly, the present invention relates to a dynamic floating input D flip-flop (DFIDFF).

2. Description of Related Art

Recently, with the development of the process, handheld electronic products have become the necessary tools in life. For the handheld electronic products, it is an important topic on the product design that the power consumption is saved to increase the lifetime of the cell and to prolong the service time of the handheld electronic product. Viewing from the power consumption formula $P=\alpha cV^2 f$, it is the most effective method to reduce the operating voltage. P is the power consumption, $\alpha$ is the activity coefficient, c is the capacitance value, v is the voltage value, and f is the operating frequency. However, in practice, it is necessary to correspondingly reduce the operating frequency to reduce the operating voltage. Therefore, it is an important topic to operate at high speed under the low voltage.

For example, in a wireless communication system, the phase-locked loop (PLL) is one of the most important basic blocks. FIG. 1A is a block diagram of a common PLL. Referring to FIG. 1A, the PLL includes a phase detector 10, a low pass filter 120, a voltage controlled oscillator 130, and a frequency divider 140. The working frequencies of the voltage controlled oscillator 130 and the frequency divider 140 limit the whole operating speed, therefore, if the voltage controlled oscillator 130 and the frequency divider 140 are effectively improved, the performance of the whole PLL is increased.

The operation formula of the frequency divider 140 is $f_{out}=f_{in}/2^M$, wherein M is the number of the D flip-flops connected in series. FIG. 1B is a circuit diagram of a basic 1/16 frequency divider 140. Referring to FIGS. 1A and 1B, because a first flip-flop 141 receives the clock signal generated by the voltage controlled oscillator 130, the operating speed of the frequency divider 140 is limited by the speed the first D flip-flop 141 can achieve. FIG. 1C is a circuit diagram of a conventional transmission gate D flip-flop (TGFF). The D flip-flop includes transmission gates 151, 152, 155, and 156, and NOT gates 153, 154, 157, and 158. Under the condition of the CMOS process of 0.13 μm and the supply voltage of 0.5 V, the highest operating frequency of the 1/16 frequency divider (as shown in FIG. 1B) formed by the conventional D flip-flop as shown in FIG. 1C is 285 MHz, and the power consumption is 1.17 μW.

In view of the above, the 1/16 frequency dividing circuit formed by the conventional TGFFs cannot achieve the high speed operation. Therefore, in "A True Single-Phase-Clock Dynamic CMOS Circuit Technique" published in the Journal of Solid-State Circuit, vol. sc-22, NO. 5, page 899-901, October 1987 by the Institute of Electrical and Electronic Engineers (IEEE) (as shown in FIG. 2), and "New single-clock CMOS latches and flip-flops with improved speed and power savings" published in the Journal of Solid-State Circuit, vol. sc-32, NO. 1, page 62-69, 1997 (as shown in FIG. 3), a true signal phase clock (TSPC) D flip-flop circuit is provided, wherein the dynamic operating is used to achieve the high speed characteristics. However, because the number the of metal oxide semiconductor (MOS) transistors connected in series in the conventional art is larger (as shown in FIG. 2, the number of the MOS transistors connected in series is four at most), the whole speed is affected when operating in low voltage. Therefore, in the conventional art, under the condition of the CMOS process of 0.13 μm and the rigor condition (i.e. 0.45_SS_125° C.), the operating frequency of the D flip-flop of FIG. 2 may be up to 400 MHz, with the power consumption of 2.8 μW. The D flip-flop of FIG. 3 may operate at 454 MHz, with the power consumption of 4.2 μW.

In addition, in the conventional art, the number of the MOS transistors connected in series may be reduced to achieve the high speed characteristics under the low voltage. For example, in "A 1.6-GHz dual modulus prescaler using the Extended True-Single-Phase-Clock CMOS circuit technique (E-TSPC)" published in the Journal of Solid-State Circuit, vol. sc-34, page 97-102, January 1999 by IEEE (as shown in FIG. 4), a high speed D flip-flop of E-TSPC architecture is provided. The dynamic D flip-flop circuit is realized by six MOS transistors divided into three stages. In the conventional art, a certain ratio relation exists between each stage, so it must be quite careful in design. Under the condition of the CMOS process technique of 0.13 μm and the working voltage of 0.5 V, the conventional art is used to realize the 1/16 frequency diving circuit, and the quickest operating frequency thereof may be up to 1 GHz. However, because the circuit connecting manner may generate large short circuit current and dc current, a lot of power consumption may be resulted. Particularly in the low speed, the short circuit current and the dc current take more than half of the total power consumption. The D flip flop is made to be a divided-by two circuit (as shown in FIG. 4A), and it can be seen that during operating, the dashed line region is the position generating the short circuit current and the dc current.

In addition, in "New Dynamic Flip-Flop for High-Speed Dual-Modulus Prescaler" published in the Journal of Solid-State Circuit, vol. sc-33, No. 10, page 1568-1571, 1998 by IEEE, another dynamic D flip-flop is provided, as shown in FIG. 5. The flip-flop is similar to the flip-flop architecture of FIG. 4, and the difference is that three MOSs connected in series are used in the middle stage, the output stages also have the ratio relation, so it is necessary to design carefully. In the D flip-flop, because some paths of the short circuit current and the dc current are reduced, the power lost is reduced slightly. Under the condition of the CMOS process of 0.13 μm and the working voltage of 0.5 V, the quickest frequency of the flip-flop in FIG. 5 may be more than 1 GHz, with the power consumption of 9.26 μW.

Although under the low voltage, the operating frequency of the conventional D flip-flop circuits as shown in FIGS. 4 and 5 may be more than 500 MHz, because of the connecting manner of the flip-flop circuit, it is much possible to generate the short circuit current and the dc current, thereby consuming a lot of power.

SUMMARY OF THE INVENTION

Accordingly, the present invention is directed to providing a DFIDFF, which comprises a floating input stage, a first string of transistors, and a second string of transistors. At a pre-charge period, the floating input stage transmits the input data to the first string of transistors, the first string of transistors stores the logic status of the input data, and pre-charges the output node to a first level. At an evaluation period, the first string of transistors decides the output node level in accordance with the data logic status stored therein, and the second string of transistors decides output level of the D flip-flop in accordance with logic status of the output node of the first string of transistors.

In the DFIDFF according to the preferred embodiment of the present invention, the floating input stage comprises a switch. A first end of the switch receives the input data, and a second end of the switch is served as the output end of the floating input stage. The switch is turned on at the pre-charge period, and the switch is turned off at the evaluation period.

The present invention provides a D flip-flop circuit, which is capable of reducing the power consumption of the short circuit current and the dc current and has preferred power-delay product (PDP).

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as-claimed.

DESCRIPTION OF EMBODIMENTS

In the following embodiments, when an element is connected or coupled to another element, it may be directly connected to or coupled to another element, or an element may be sandwiched there between. Oppositely, when an element is directly connected or directly coupled to another element, the element sandwiched there between does not exist.

Figure 6:
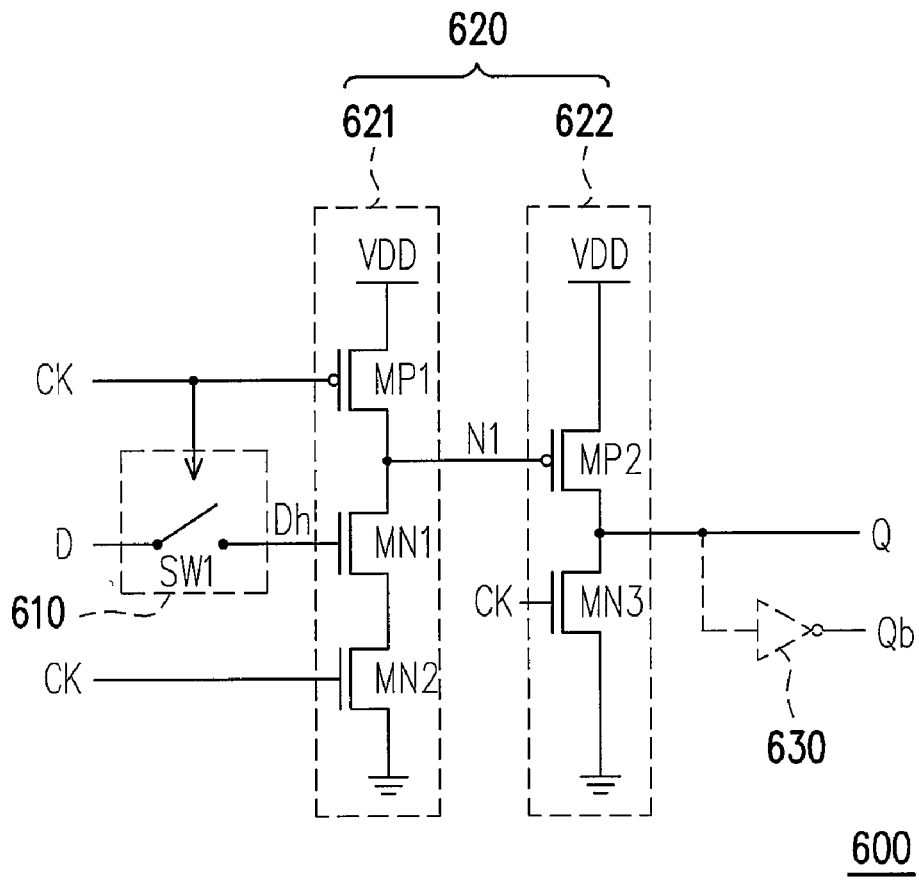
FIG. 6 is a circuit diagram of a DFIDFF according to an embodiment of the present invention.

FIG. 6 is a circuit diagram of a DFIDFF according to an embodiment of the present invention. Referring to FIG. 6, the DFIDFF 600 includes a floating input stage 610, and a latch stage 620. At a pre-charge period, the floating input stage 610 transmits an input data D to an output end (i.e. to a node Dh) in accordance with the timing of a clock signal CK. The latch stage 620 includes a first string of transistor 621 and a second string of transistor 622. An input node Dh of the string of transistors 621 is coupled to the output end of the floating input stage 610. In accordance with the timing of the clock signal CK, at the pre-charge period, the string of transistors 621 stores the logic status of the input data D, and pre-charges the output node N1 to the first level (e.g. the supply voltage VDD). At an evaluation period, the string of transistors 621 decides the level of the output node N1 of the string of transistors 621 in accordance with the stored input data D previously stored therein.

An input node of the second string of transistors 622 is coupled to the output node N1 of the string of transistors 621, and an output node of the string of transistors 622 provides a first output signal Q of the D flip-flop 600. In accordance with the timing of the clock signal CK, at the pre-charge period, the output node of the string of transistors 622 is floated. At the evaluation period, in accordance with the logic status of the output node N1 of the string of transistors 621, the level of the first output signal Q output by the string of transistors 622 is decided.

In this embodiment, the D flip-flop 600 further includes a NOT gate 630. An input end of the NOT gate 630 is coupled to the output node of the string of transistors 622, and an output end of the NOT gate 630 provides a second output signal Qb of the D flip-flop 600.

In this embodiment, the first string of transistors 621 includes a first P-type transistor MP1, a first N-type transistor MN1, and a second N-type transistor MN2. A source of the transistor MP1 is coupled to the supply voltage VDD, a gate receives the clock signal CK, and a drain of the transistor MP1 is served as the output node N1 of the first string of transistors 621. A drain of the transistor MN1 is coupled to the drain of the transistor MP1, and a gate of the transistor MN1 is served as the input node Dh of the first string of transistors 621. A drain of the MN2 is coupled to the source of the transistor MN1, a gate of the transistor MN2 receives the clock signal CK, and a source of the transistor MN2 is grounded.

In this embodiment, the second string of transistors 622 includes a second P-type transistor MP2 and a third N-type transistor MN3. A source of the transistor MP2 is coupled to the supply voltage VDD, a gate of the transistor MP2 is served as the input node of the second string of transistors 622, and a drain of the transistor MP2 is served as the output node of the second string of transistors 622. A drain of the transistor MN3 is coupled to the drain of the transistor MP2, a gate of the transistor MN3 receives the clock signal CK, and a source of the transistor MN3 is grounded.

Figure 7A:
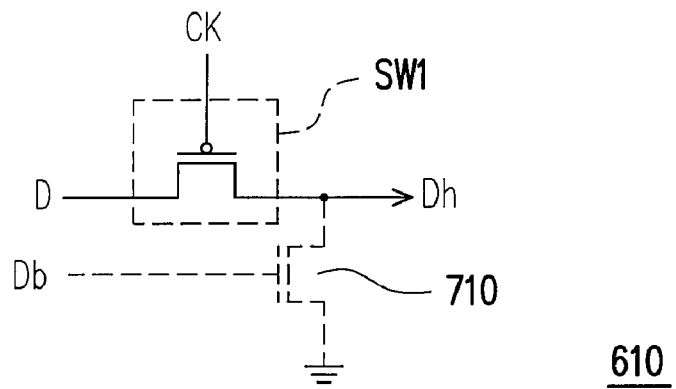
FIGS. 7A-7C are various implementation examples of the floating input stage in FIG. 6 according to the present invention.
Figure 7B:
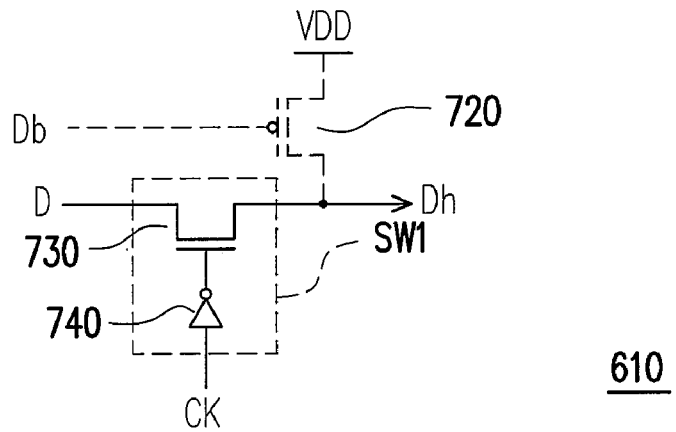
Figure 7C:
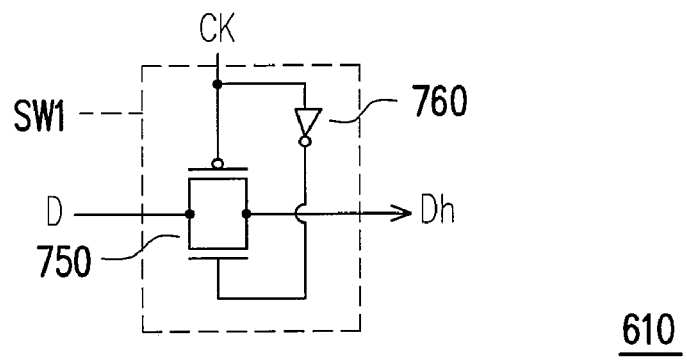

In this embodiment, the floating input stage 610 includes a switch SW1. In accordance with the timing of the clock signal CK, at the pre-charge period, the switch SW1 transmits the input data D at the first end to the input node Dh of the string of transistors 621. At the evaluation period, the switch SW1 is turned off. FIGS. 7A-7C are implementation examples of the floating input stage 610 in FIG. 6 according to the present invention. Referring to FIG. 7A, the switch SW1 is implemented as a P-type transistor. A source and a drain of the P-type transistor are respectively served as the first end and the second end of the switch SW1, and a gate of the P-type transistor receives the clock signal CK.

Referring to FIGS. 6 and 7A, when the clock signal CK is at a low level (at the pre-charge period), the switch SW1 transmits the input data D to the node Dh (at this point, the input data D is stored in the parasitic capacitor of the node Dh), and controls the on/off state of the N-type transistor MN1. When the clock signal CK is at the low level, the transistor MP1 is turned on and pre-charges the node N1 to the supply voltage VDD. When the clock signal CK converts from the low level to the high level, the transistor MP1 and the switch SW1 are turned off, and the transistors MN2 and MN3 are turned on. Because the parasitic capacitor on the node Dh may maintain the input data D, and the on/off state of the transistor MN1 has already decided, when the clock signal CK is at a high level (i.e. at the evaluation period), it is immediately decided whether the potential of the node N1 is high level or low level. Finally, the input data D is output as the first output signal Q of the D flip-flop 600 through a ratio circuit formed by transistors MP2 and MN3. Therefore, the latch stage 620 maintains the data D at the pre-charge period, and quickly transmits the data at the evaluation period.

When the D flip-flop 600 circuit is designed, because the switch SW1 is implemented as a P-type transistor in this embodiment, when the input data D is at a low potential, the transistor MN1 cannot totally turned off as the P-type transistor cannot transmit the complete 0 V, thus causing the leakage current, and affecting the function of the circuit. Therefore, the designer may arrange an N-type transistor 710 in the floating input stage 610. A drain of the N-type transistor 710 is coupled to the second end of the switch SW1, a source of the N-type transistor 710 is grounded, and a gate of the N-type transistor 710 receives an inverse signal Db of the input date. The function of the N-type transistor 710 is that when the input data D is at a low level, the potential of the node Dh is drawn to the complete 0 V. Because of the function of the transistor 710, the transistor 710 may be designed to be in a small size.

Figure 8:
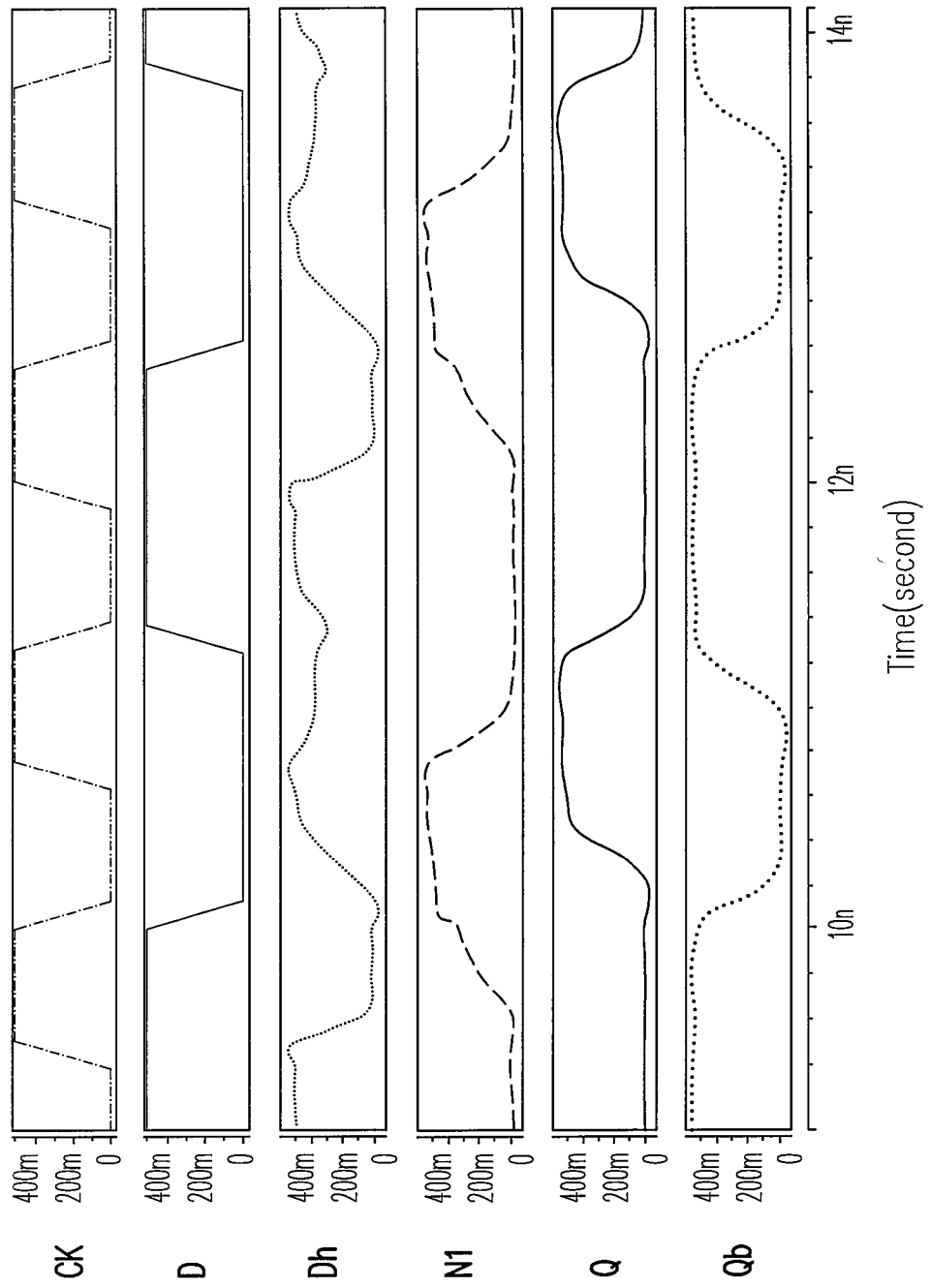
FIG. 8 is an analog waveform of the DFIDFF in FIG. 6.

In addition, because the second string of transistors 622 is a ratio circuit in this embodiment, it is necessary to carefully design the ratio relation of the transistors MP2 and MN3. The designers may design the size ratio of the transistors MP2 and MN3 according to the requirement, so as to obtain the duty cycle of the output signal Q, for example, the duty cycle of the output signal Q of 50%. FIG. 8 is an analog waveform of the DFIDFF 600 of FIG. 6. FIG. 8 is an analog result finished under the environment of the CMOS process of 0.13 μm and the working voltage of 0.5 V.

The conventional arts of FIGS. 1C, 2, 3, 4, and 5 etc. are respectively referred to as conventional 1, conventional 2, conventional 3, conventional 4, and conventional 5 herein below. The D flip-flop 600 of FIG. 6 is compared with the conventional arts of FIGS. 1C, 2, 3, 4, and 5 etc. Here, the D flip-flops of conventional 1 to conventional 5 and the D flip-flop 600 of this embodiment are respectively used to realize the 1/16 frequency dividing circuit, and various analysis and comparison are performed under the CMOS process of 0.13 μm.

The analysis and comparison may be divided into five parts. The first part is that under the condition of the supply voltage of 0.5 V, process shift, and temperature variation, the quickest operating frequency, power consumption, and PDP value of various high speed D flip-flops are compared. The second part is comparing the ratio of the dynamic and static power consumption of various high speed D flip-flops. The third part is comparing the 1/16 frequency diving circuits implemented by various D flip-flops and comparing the power consumption thereof at various operating frequencies. The fourth part is comparing the quickest operating frequency, the power loss, and the PDP value of each 1/16 frequency dividing circuit under the condition of the voltage lower than 1V. The fifth part is a summary, the comparison of the quickest operating frequency, the power consumption, the PDP value and the PDP after normalization of each 1/16 frequency diving circuit under the working voltage of 0.5 V.

Figure 9:
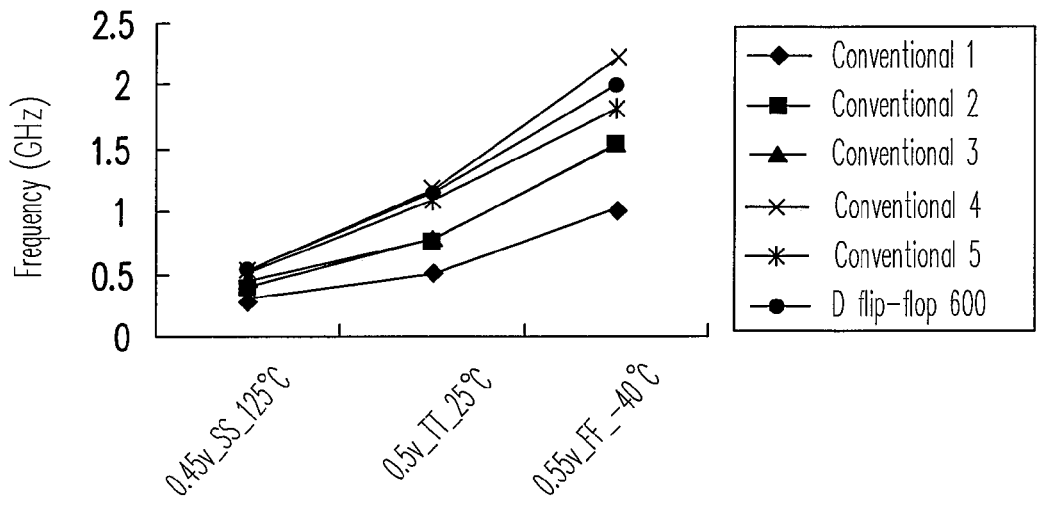
FIGS. 9-11 are characteristic curve diagrams of the D flip-flop of FIG. 6 under the condition of CMOS process of 0.13 μm, supply voltage of 0.5 V, process offset parameter (TT, FF, SS), and temperature variation (−40° C., 25° C., 125° C.) compared with various conventional high speed D flip-flops.
Figure 10:
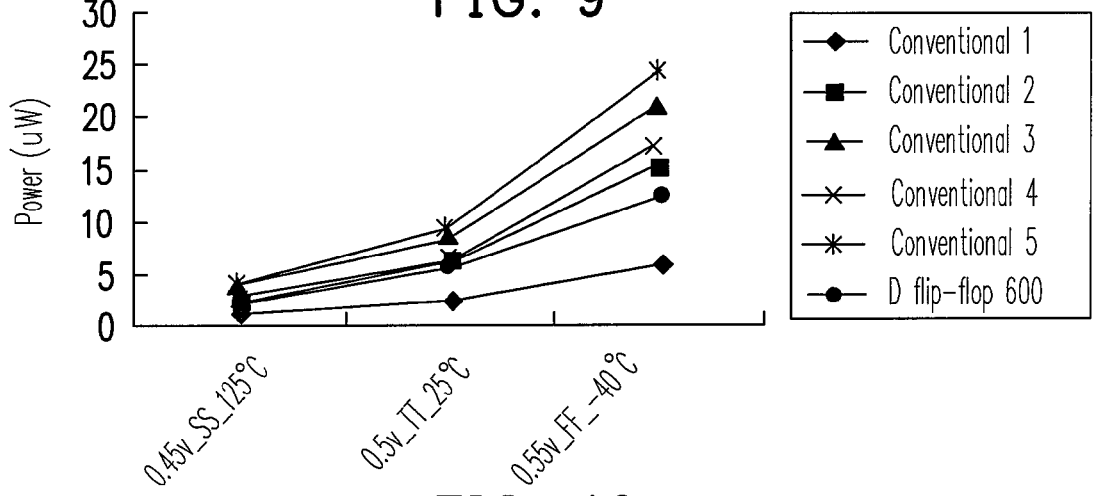
Figure 11:
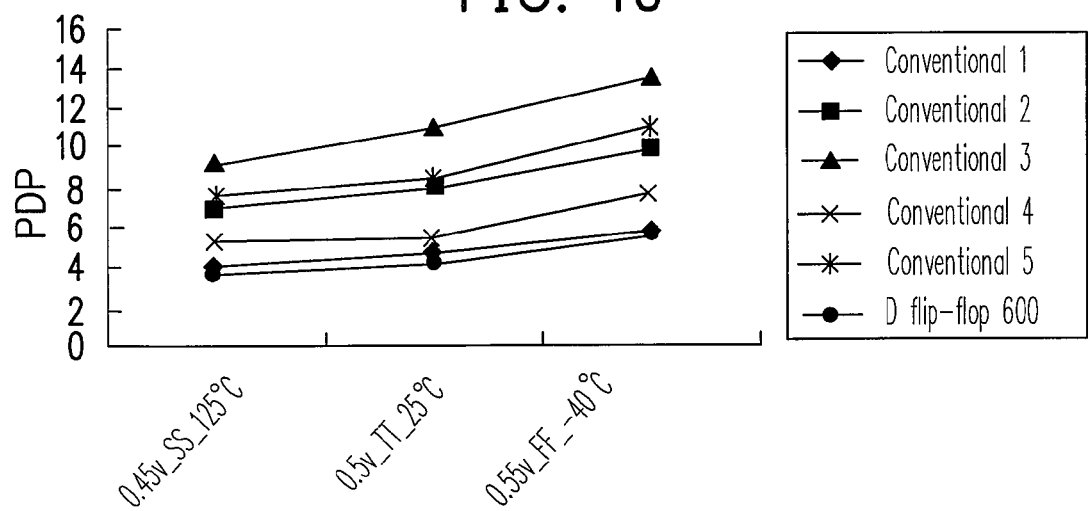

Under the condition of the CMOS process of 0.13 μm, the supply voltage of 0.5 V, the process offset parameter (TT, FF, SS), and the temperature variation (−40° C., 25° C., 125° C.), the characteristics of various high speed conventional D flip-flop circuits are compared. The quickest frequencies of various flip-flop circuits are shown in FIG. 9, the power consumption under the quickest operating frequency is shown in FIG. 10, and the power-delay product (PDP) values are shown in FIG. 11. It can be known from FIG. 11 that the D flip-flop 600 of this embodiment has the most preferable PDP value.

Figure 12:
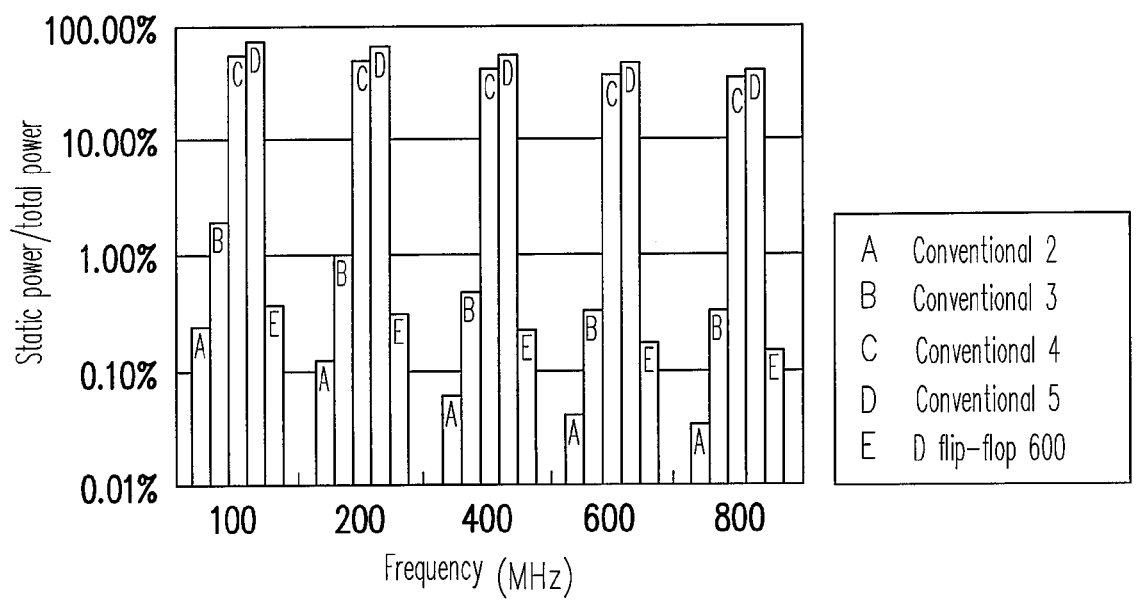
FIG. 12 is a ratio relation diagram of the static power consumption and the total power consumption of the D flip-flop of FIG. 6 under different operating frequency compared with various conventional high speed D flip-flop circuits.

As described above, no matter for the D flip-flop circuit of the conventional 4 or the conventional 5, it is much possible to generate the short circuit current and the dc current, thus resulting in the power loss. Therefore, in the second part, the ratio relation of the static power consumption and the total power consumption of various D flip-flops under different operating frequencies. As shown in FIG. 12, in different D flip-flops, the static power consumption of the conventional 4 architecture and the conventional 5 architecture takes more than half of the total power consumption. Although the conventional 4 and the conventional 5 may be operated at a high frequency, high total power consumption exists. It is known from FIG. 12 that the static power consumption of the D flip-flop 600 of this embodiment only takes less than 1% of the total power consumption.

Figure 1A:
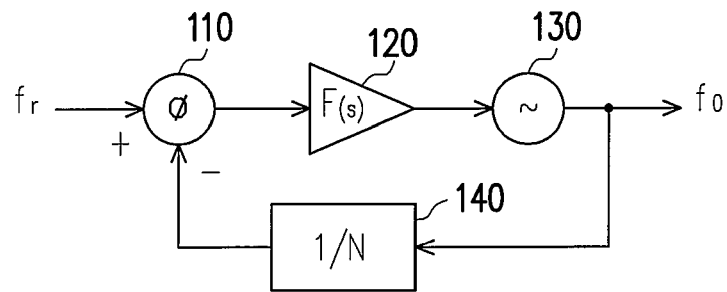
FIG. 1A is a block diagram of a common phase-locked loop (PLL).
Figure 1B:
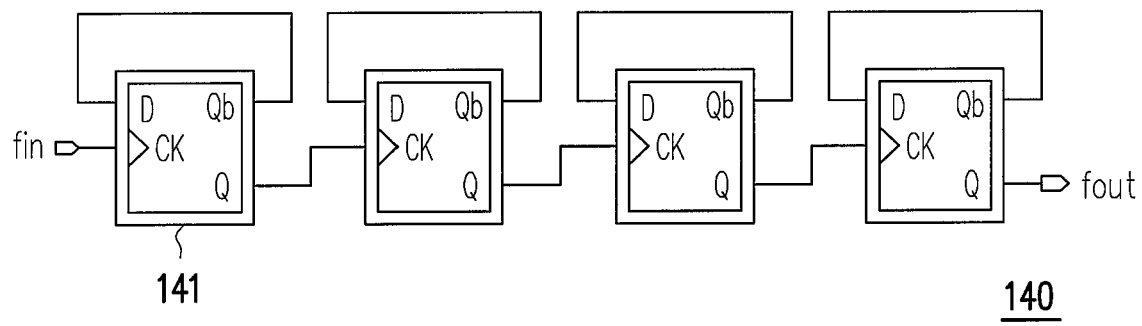
FIG. 1B is a circuit diagram of a basic 1/16 frequency divider.
Figure 1C:
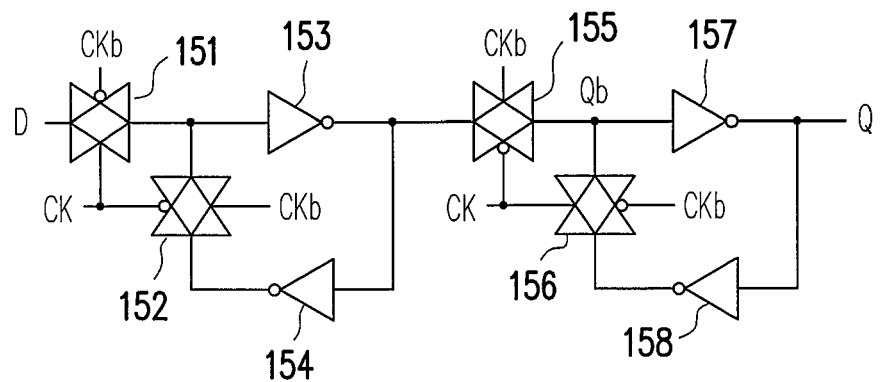
FIG. 1C is a circuit diagram of a conventional transmission gate D flip-flop.
Figure 2:
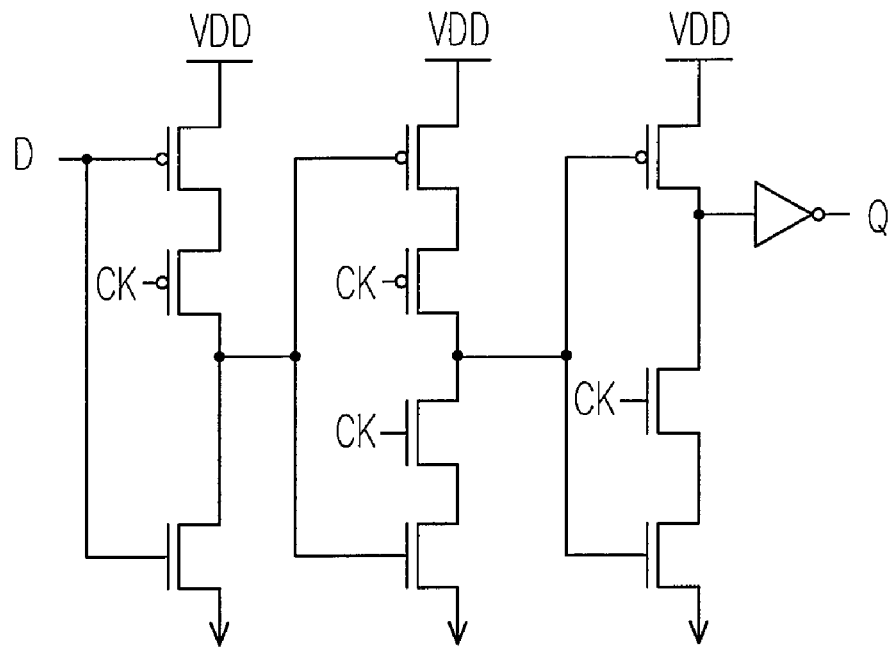
FIG. 2 is a circuit diagram of a D flip-flop published in Journal of Solid-State Circuit, vol. sc-22, NO. 5, page 899-901, 1987 by Institute of Electrical and Electronic Engineers (IEEE).
Figure 3:
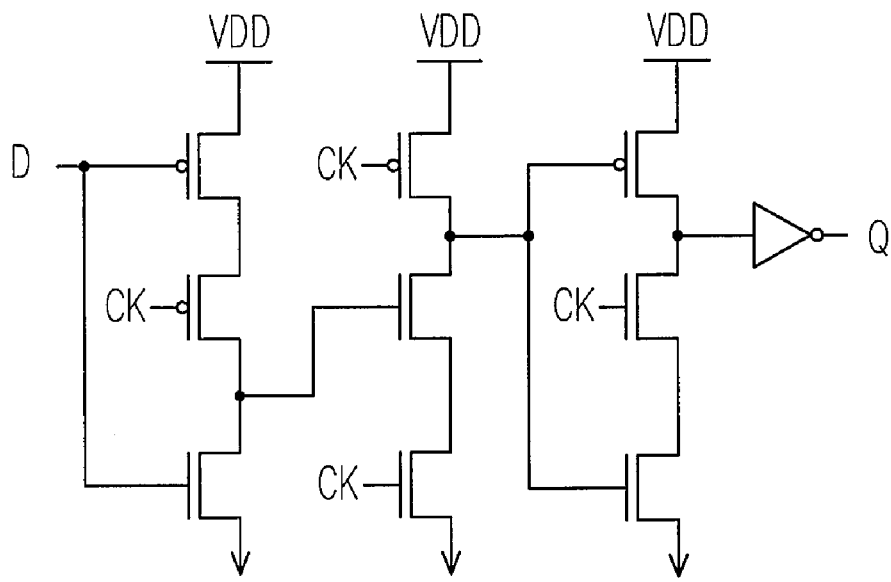
FIG. 3 is a circuit diagram of a D flip-flop published in Journal of Solid-State Circuit, vol. sc-32, NO. 1, page 62-69, 1997 by IEEE.
Figure 4:
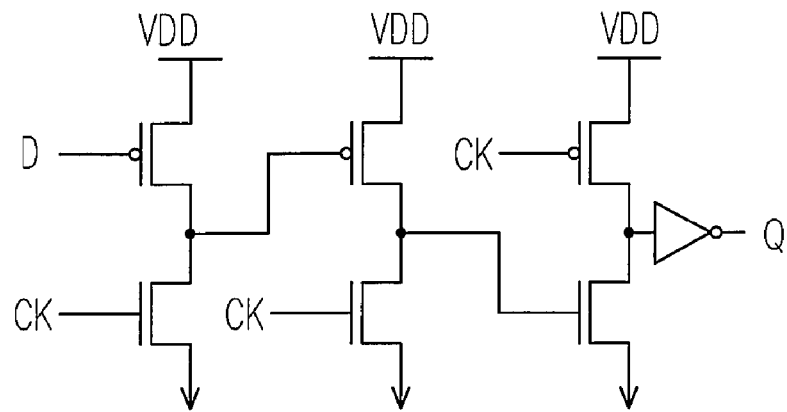
FIG. 4 is a circuit diagram of a D flip-flop published in Journal of Solid-State Circuit, vol. sc-34, page 97-102, January 1999 by IEEE.
Figure 4A:
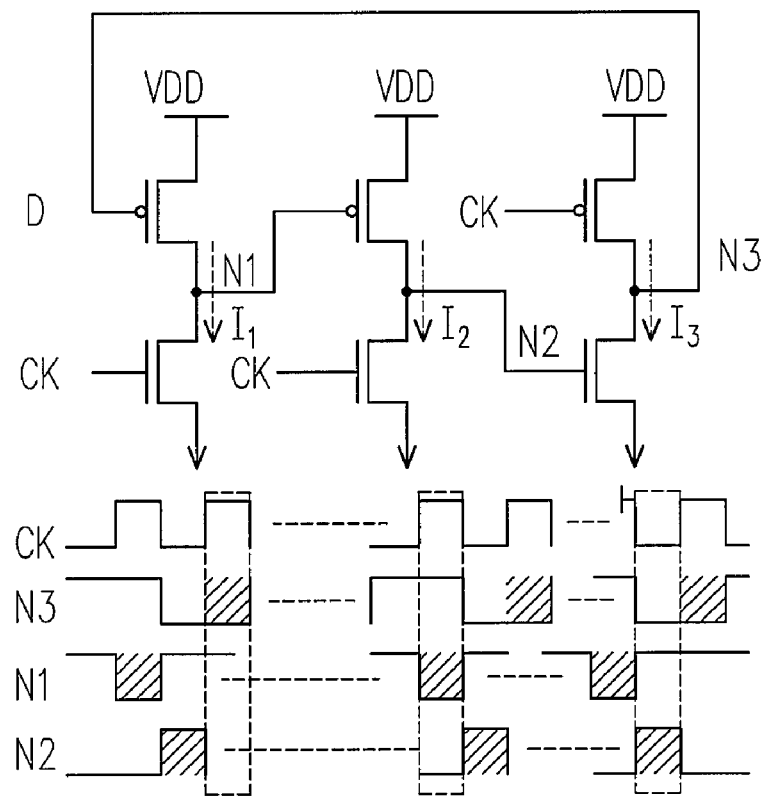
FIG. 4A is a ½ frequency dividing circuit formed by connecting the D flip-flops of FIG. 4 and a signal timing chart thereof.
Figure 5:
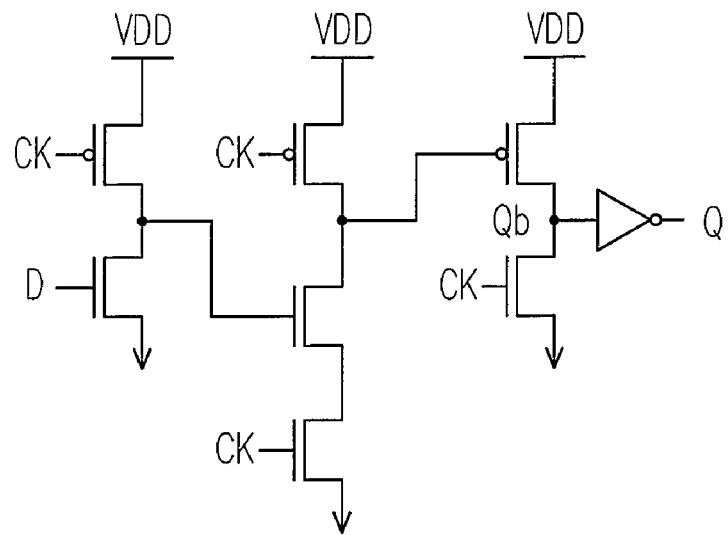
FIG. 5 is a circuit diagram of a D flip-flop published in Journal of Solid-State Circuit, vol. sc-33, NO. 10, page 1568-1571, 1998 by IEEE.
Figure 13:
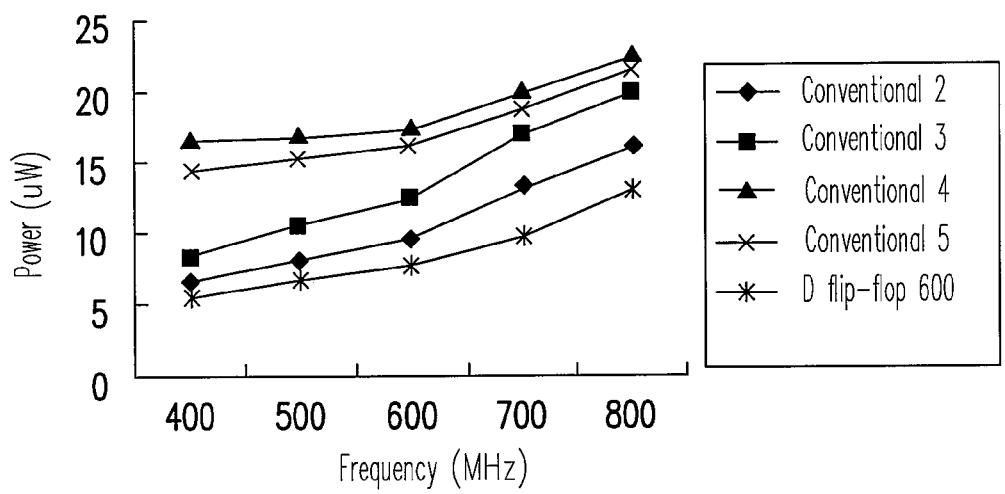
FIG. 13 is a comparative diagram of the frequency divider circuits implemented by the D flip-flop of FIG. 6 and various conventional high speed D flip-flops.

Next, under the condition of the supply voltage of 0.5 V, various D flip-flop circuits are used to realize the 1/16 frequency divider circuit. Referring to the 1/16 frequency divider circuit as shown in FIG. 1B, because the circuit is connected in series, and the speed is limited to the first stage D flip-flop, various high speed D flip-flops only replace the first stage. The remaining stages are low speed D flip-flops, so the conventional TGFFs are adopted. The power loss may be reduced, and the output 1/16 signal has 50% duty cycle. FIG. 13 is a comparative diagram of various frequency divider circuits.

Figure 14:
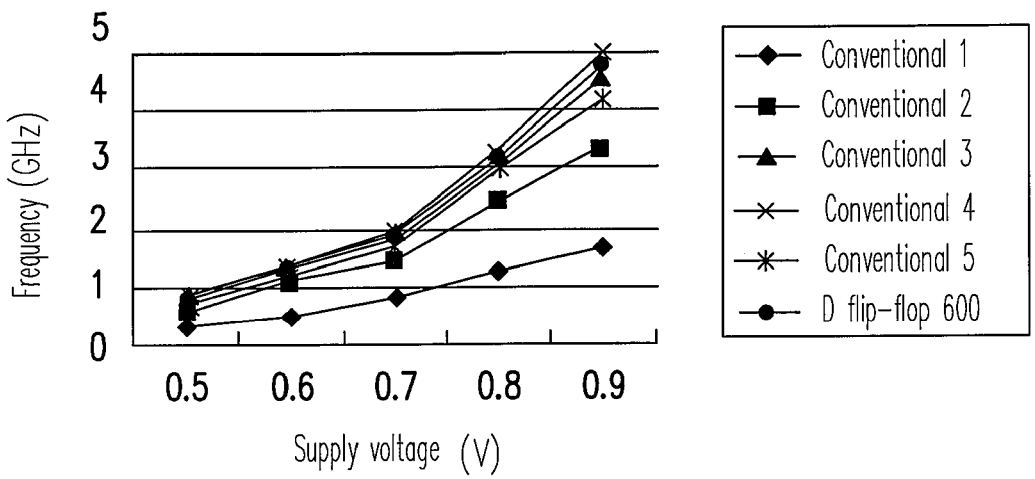
FIGS. 14-16 are comparative diagrams of the quickest operating frequency, power loss, and PDP value of the frequency divider implemented by the D flip-flop of FIG. 6 and the conventional high speed D flip-flops, when operating in the environment of the voltage lower than 1 V.
Figure 15:
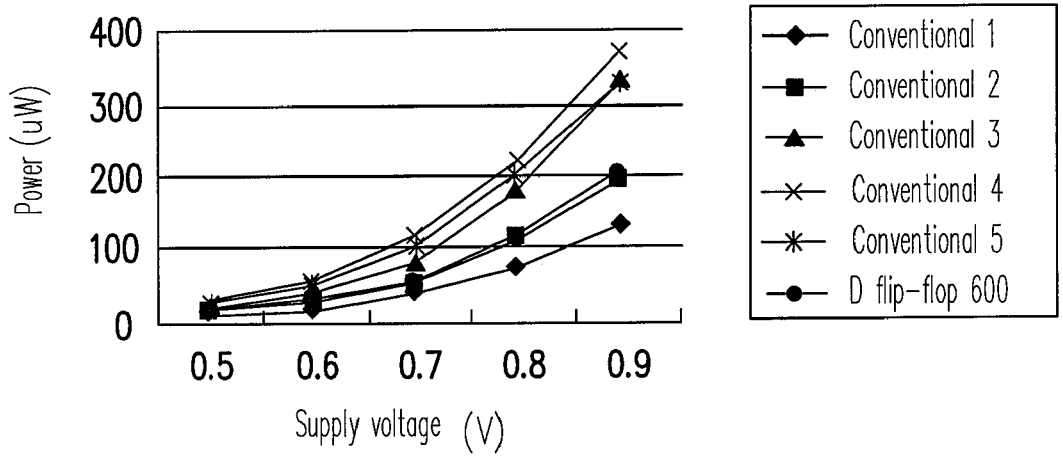
Figure 16:
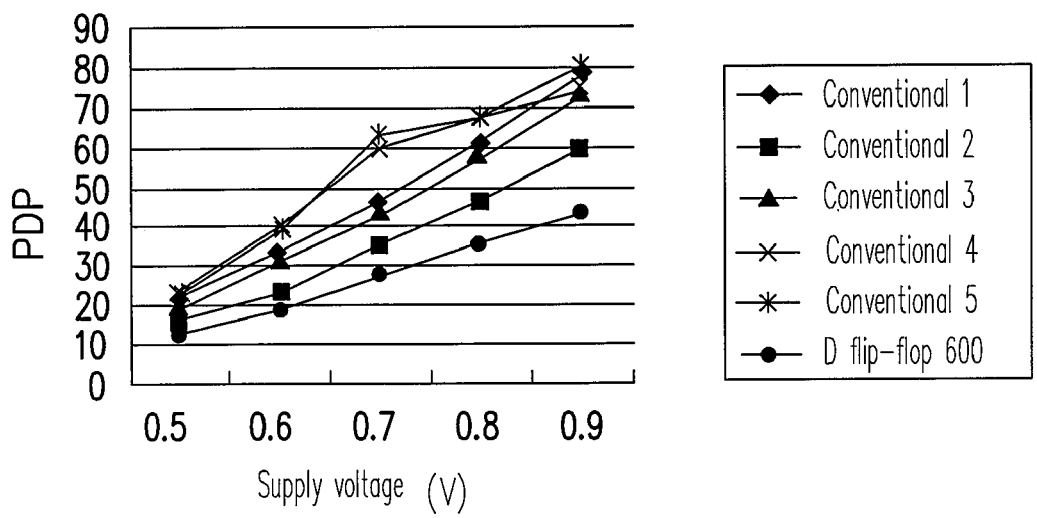

Under the environment of the voltage lower than 1V, the quickest operating frequencies, the power losses, and the PDP values of the 1/16 frequency dividing circuits using various D flip-flops as the first stage are respectively shown in FIGS. 14, 15, and 16. As shown in FIG. 14, when the supply voltage is lower than 1V, the D flip-flop 600 of this embodiment is only slower than the conventional 4 architecture. As shown in FIG. 15, the power consumption of the D flip-flop 600 of this embodiment is only higher than the conventional 1 and conventional 2 architectures. FIG. 16 shows the PDP of each D flip-flop. It is clearly known from the figure that the D flip-flop 600 of this embodiment has the most preferable PDP value.

Finally, as shown in table 1, the whole data and parameter are totally listed. The quickest operating frequency, the power loss, the PDP value, and the normalized PDP value of the 1/16 frequency dividing circuits formed by various D flip-flops are compared. Referring to the normalized PDP value of the following table, as compared with other 1/16 frequency dividing circuits formed by the conventional D flip-flops, the 1/16 frequency dividing circuit formed by the D flip-flop 600 of this embodiment has an improvement of more than 30%.

TABLE 1

Comparative table of the D flip-flop 600 of this embodiment and conventional arts

| 1/16 frequency dividing circuit | Highest frequency | Power | PDP | Normalized PDP | Area |
| --- | --- | --- | --- | --- | --- |
| Conventional 1 | 285 MHz | 6.407 μW | 22.42 | 1.77 | 1.54 |
| Conventional 2 | 625 MHz | 10.22 μW | 16.35 | 1.29 | 1.38 |
| Conventional 3 | 781 MHz | 15.83 μW | 20.26 | 1.60 | 1.36 |
| Conventional 4 | 800 MHz | 18.64 μW | 23.3 | 1.84 | 1 |
| Conventional 5 | 769 MHz | 16.88 μW | 21.94 | 1.73 | 1.04 |
| This embodiment | 787 MHz | 9.95 μW | 12.63 | 1 | 1.27 |

In the D flip-flop 600 of FIG. 6, the implementation of the floating input stage 610 is not limited to the above manner. Those of the ordinary art in the field may realize the floating input stage 610 by any method according to the spirit and the teaching of the embodiments of the present invention. For example, FIGS. 7B and 7C are other possible embodiments of the floating input stage 610. In FIG. 7B, the floating input stage 610 includes a switch SW1 and a P-type transistor 720. A drain of the P-type transistor 720 is coupled to a second end of the switch SW1, a source of the P-type transistor 720 is coupled to the supply voltage VDD, and a gate of the transistor 720 receives an inverse signal Db of the input date. The function of the P-type transistor 720 is that when the input data D is a high level, the potential of the node Dh is drawn to a complete VDD level. Therefore, the transistor 720 may be designed to be in a small size.

In FIG. 7B, the switch SW1 includes a NOT gate 740, and an N-type transistor 730. An input end of the NOT gate 740 receives a clock signal CK, and an output end of the NOT gate 740 is coupled to a gate of the N-type transistor 730. A source and a drain of the N-type transistor 730 are respectively served as the first end and the second end of the switch SW1.

In FIG. 7C, the switch SW1 of the floating input stage 610 includes a NOT gate 760 and a transmission gate 750. An input end of the NOT gate 760 receives the clock signal CK. A first end and a second end of the transmission gate 750 are respectively served as the first end and the second end of the switch SW1. A first gate of the transmission gate 750 (the gate of the P-type transistor here) receives the clock signal CK, and a second gate of the transmission gate 750 (the gate of the N-type transistor here) is coupled to an output end of the NOT gate 760.

Figure 17:
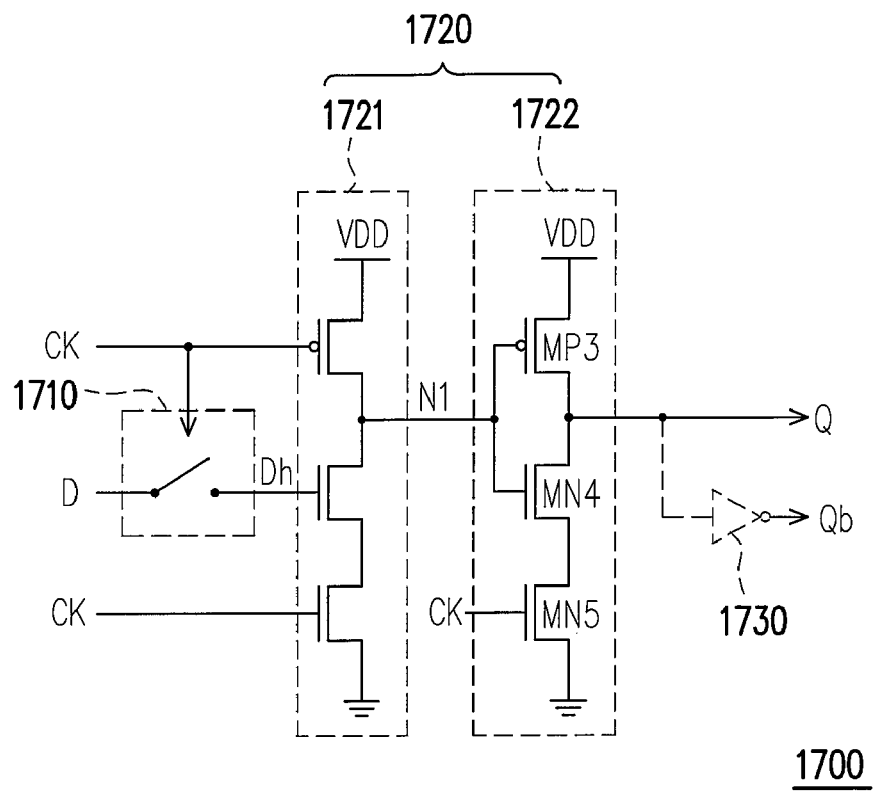
FIG. 17 is an embodiment of another DFIDFF according to the present invention.

Those of the ordinary art in the field may realize the DFIDFF by any method as required according to the spirit and the teaching of the embodiments of the present invention. For example, FIG. 17 shows the embodiment of another DFIDFF according to the present invention. Referring to FIG. 17, the D flip-flop 1700 includes a floating input stage 1710, a latch stage 1720, and a NOT gate 1730. The latch stage 1720 includes a first string of transistors 1721 and a second string of transistors 1722. In this embodiment, the floating input stage 1710, the first string of transistors 1721, and the NOT gate 1730 may be implemented with reference to the floating input stage 610, the first string of transistors 621, and the NOT gate 630 of the above embodiment (FIG. 6), so they are not described here. The second string of transistors 1722 includes a third P-type transistor MP3, a fourth N-type transistor MN4, and a fifth N-type transistor MN5. A source of transistor MP3 is coupled to the supply voltage VDD, a gate of the transistor MP3 is served as the input node of the second string of transistors 1722, and a drain of the transistor MP3 is served as the output node of the second string of transistors 1722. A drain of the transistor MN4 is coupled to the drain of the transistor MP3, and a gate of the transistor MN4 is coupled to the gate of the transistor MP3. A drain of the transistor MN5 is coupled to the source of the transistor MN4, a gate of the transistor MN5 receives the clock signal CK, and a source of the transistor MN5 is grounded.

When the clock signal CK is at the low level, the first string of transistors 1721 pre-charges the node N1 pre-charge to the supply voltage VDD. Therefore, at the pre-charge period, the transistors MP3 and MN5 are turned off (at this point, the output node of the second string of transistors 1722 is floated). When the clock signal CK is at the high level (i.e. at the evaluation period), the first string of transistors 1721 may immediately decide whether the potential of the node N1 is at high level or low level, therefore the second string of transistors 1722 outputs the input data D as a first output signal Q of the D flip-flop 1700. The output end of the NOT gate 1730 provides a second output signal Qb of the D flip-flop 1700. Therefore, the latch stage 1720 maintains the data D at the pre-charge period, and quickly transmits the data at the evaluation period.

Figure 18:
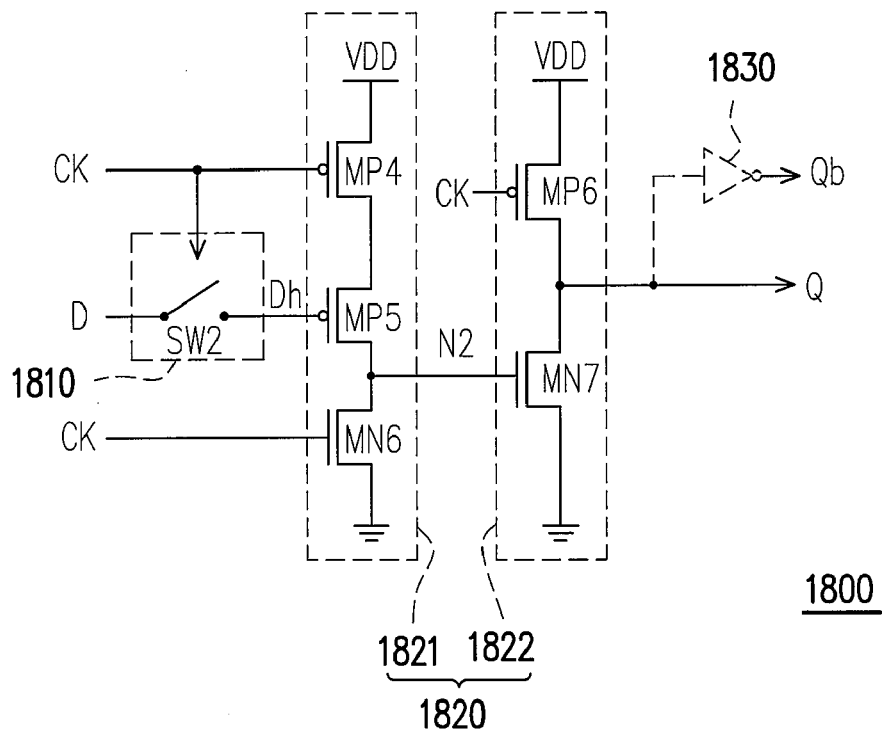
FIG. 18 is another embodiment of the DFIDFF according to the present invention.

FIG. 18 is another embodiment of the DFIDFF according to the present invention. Referring to FIG. 18, the D flip-flop 1800 includes a floating input stage 1810, a latch stage 1820, and a NOT gate 1830. The latch stage 1820 includes a first string of transistors 1821 and a second string of transistors 1822.

Figure 19A:
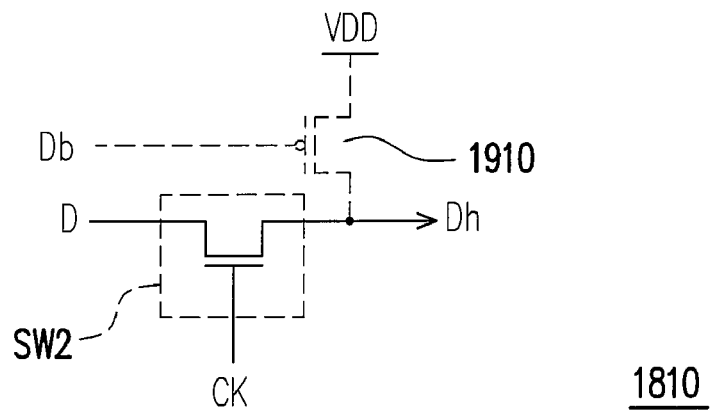
FIGS. 19A-19C are various implementation examples of the floating input stage of FIG. 18 according to the present invention.
Figure 19B:
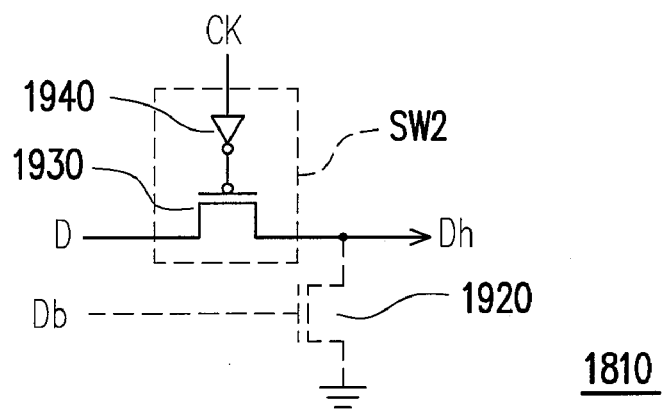
Figure 19C:
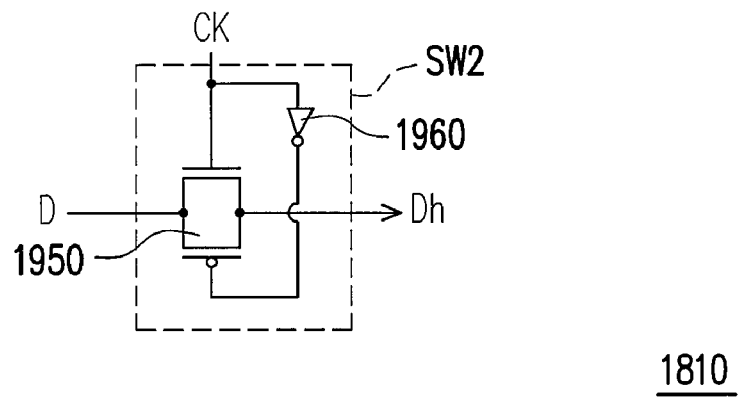

In this embodiment, the floating input stage 1810 includes a switch SW2. According to the timing of the clock signal CK, at a pre-charge period, the switch SW2 transmits the input data D at the first end to the input node Dh of the string of transistors 1821, and the switch SW2 is turned off at an evaluation period. FIGS. 19A to 19C are various implementation examples of the floating input stage 1810 in FIG. 18 according to the present invention. Referring to FIG. 19A, the switch SW2 is implemented as an N-type type transistor. A source and a drain of the N-type transistor are respectively served as the first end and the second end of the switch SW2, and a gate of the N-type transistor receives the clock signal CK. The floating input stage 1810 transmits the input data D to the output end (i.e. to the node Dh) at the pre-charge period in accordance with the timing of the clock signal CK.

Referring to FIG. 18, the first string of transistors 1821 includes a fourth P-type transistor MP4, a fifth P-type transistor MP5, and a sixth N-type transistor MN6. A source of the transistor MP4 is coupled to the supply voltage VDD, and a gate of the transistor MP4 receives the clock signal CK. A source of the transistor MP5 is coupled to a drain of the transistor MP4, a gate of the transistor MP5 is served as the input node Dh of the first string of transistors 1821, and a drain of the transistor MP5 is served as the output node N2 of the first string of transistors 1821. A drain of the transistor MN6 is coupled to the drain of the transistor MP5, a gate of the transistor MN6 receives the clock signal CK, and a source of the transistor MN6 is grounded. According to the timing of the clock signal CK, at the pre-charge period, the string of transistors 1821 stores the logic status of the input date D, and pre-charges the output node N2 to the first level (e.g., the ground voltage). At the evaluation period, the string of transistors 1821 decides the level of the output node N2 of the string of transistors 1821 according to the logic status of the input date D stored therein.

The second string of transistors 1822 includes a sixth P-type transistor MP6 and a seventh N-type transistor MN7. A source of the transistor MP6 is coupled to the supply voltage VDD, a gate of the transistor MP6 receives the clock signal CK, and a drain of the transistor MP6 is served as the output node of the second string of transistors 1822. A drain of the transistor MN7 is coupled to the drain of the transistor MP6, a source of the transistor MN7 is grounded, and a gate of the transistor MN7 is served as the input node of the second string of transistors 1822.

Referring to FIGS. 18 and 19A, when the clock signal CK is at a high level (at the pre-charge period), the switch SW2 transmits the input date D to the node Dh (at this point, the input data D is stored in the parasitic capacitor of the node Dh), so as to control the on/off state of the P-type transistor MP5. When the clock signal CK is at the high level, the transistor MN6 is turned on to pre-charge the node N2 to the ground voltage. When the clock signal CK converts from the low level to the high level, the transistor MN6 and the switch SW2 are turned off, and the transistors MP4 and MP6 are turned on. Because the parasitic capacitor on the node Dh may maintain the input data D, and the on/off state of the transistor MP5 has already decided, when the clock signal CK is at a low level (i.e. at the evaluation period), it is immediately decided whether the potential of the node N2 is high level or low level. Finally, the input data D is output as a first output signal Q of the D flip-flop 1800 through a ratio circuit formed by transistors MP6 and MN7. The output end of the NOT gate 1830 provides a second output signal Qb of the D flip-flop 1800. Therefore, the latch stage 1820 maintains the data D at the pre-charge period, and quickly transmits the data at the evaluation period.

When the D flip-flop 1800 circuit is designed, because the switch SW2 is implemented as an N-type transistor in this embodiment, when the input data D is at a high potential, the transistor MP5 cannot totally be turned off because the N-type transistor cannot transmit the complete supply voltage VDD, thus causing the leakage current, and affecting the function of the circuit. Therefore, the designer may arrange a P-type transistor 1910 in the floating input stage 1810. A drain of the P-type transistor 1910 is coupled to the second end of the switch SW2, a source of the P-type transistor 1910 is coupled to the supply voltage VDD, and a gate of the P-type transistor 1910 receives the inverse signal Db of the input date. The function of the P-type transistor 1910 is that when the input data D is at a high level, the potential of the node Dh is drawn to the complete supply voltage VDD. Therefore, the transistor 1910 may be designed to be in a small size.

In addition, because the second string of transistors 1822 is a ratio circuit in this embodiment, it is necessary to carefully design the ratio relation of the transistors MP6 and MN7. The designers may design the appearance ratio of the transistors MP6 and MN7 according to the requirement, so as to obtain the desired duty cycle of the output signal Q, for example the duty cycle of 50%.

In the D flip-flop 1800 of FIG. 18, the implementations of the floating input stage 1810 are not limited to the above manner. Those of the ordinary art in the field may realize the floating input stage 1810 by any method according to the spirit and the teaching of the embodiments of the present invention. For example, FIG. 19B and FIG. 19C are other possible embodiments of the floating input stage 1810. In FIG. 19B, the floating input stage 1810 includes a switch SW2 and an N-type transistor 1920. The switch SW2 includes a NOT gate 1940, and a P-type transistor 1930. An input end of the NOT gate 1940 receives the clock signal CK, and an output end of the NOT gate 1940 is coupled to a gate of the P-type transistor 1930. A source and a drain of the P-type transistor 1930 are respectively served as the first end and the second end of the switch SW2. A drain of the N-type transistor 1920 is coupled to the second end of the switch SW2, and a source of the N-type transistor 1920 is grounded, and a gate of the N-type transistor 1920 receives the inverse signal Db of the input date. The function of the N-type transistor 1920 is that when the input data D is at the low level, the potential of the node Dh is drawn to the complete ground level. Therefore, the transistor 1920 may be designed to be in a small size.

In FIG. 19C, the switch SW2 of the floating input stage 1810 includes a NOT gate 1960 and a transmission gate 1950. An input end of the NOT gate 1960 receives the clock signal CK. A first end and a second end of the transmission gate 1950 are respectively served as the first end and the second end of the switch SW2. A first gate of the transmission gate 1950 (here the gate of the N-type transistor) receives the clock signal CK, and a second gate of the transmission gate 1950 (here the gate of the P-type transistor) is coupled to the output end of the NOT gate 1960.

Figure 20:
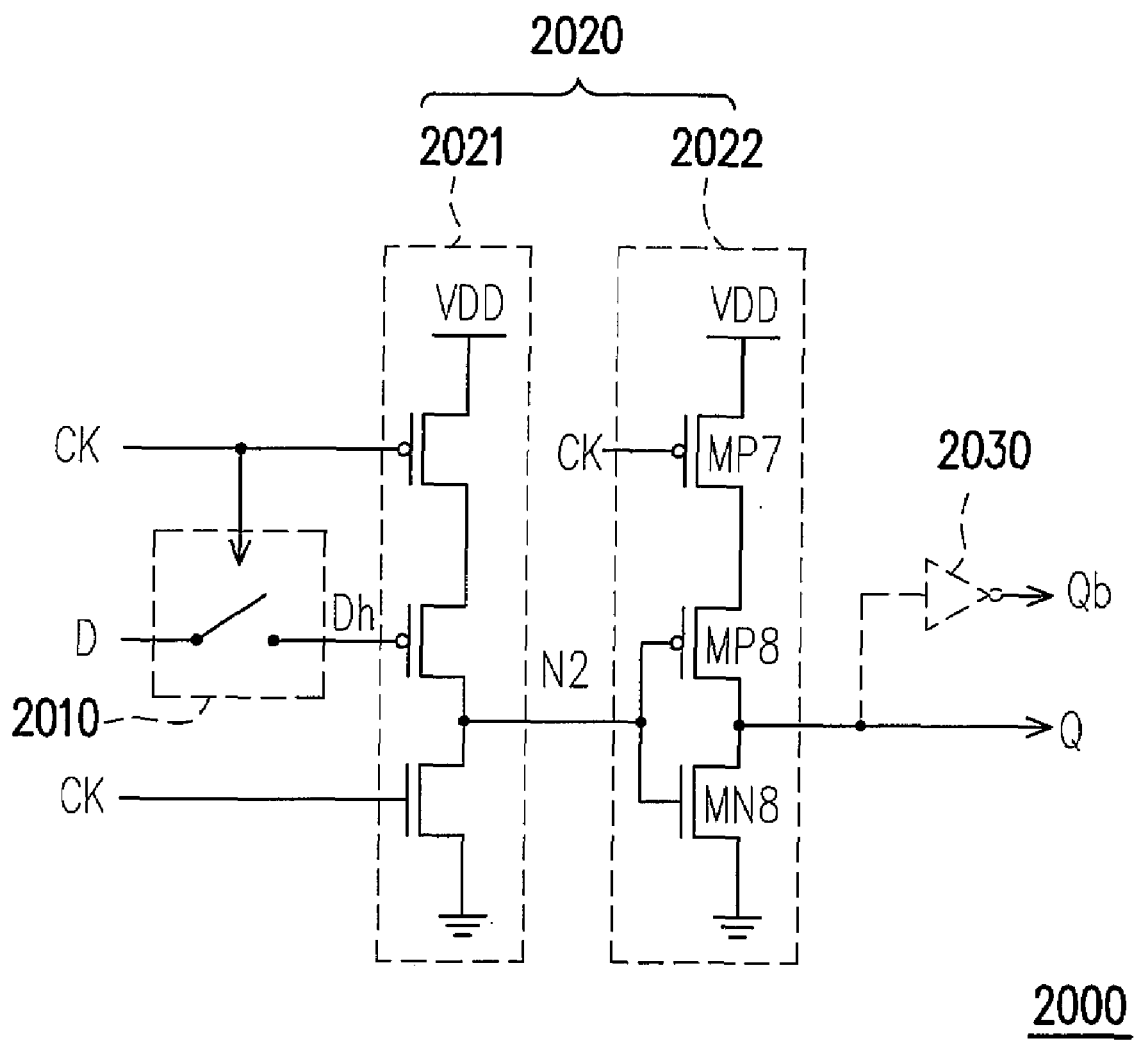
FIG. 20 is an embodiment of another DFIDFF according to the present invention.

Those of the ordinary art in the field may realize the DFIDFF by any method according to the spirit and the teaching of the embodiments of the present invention as desired. For example, FIG. 20 is an embodiment of another DFIDFF according to the present invention. Referring to FIG. 20, the D flip-flop 2000 includes a floating input stage 2010, a latch stage 2020, and a NOT gate 2030. The latch stage 2020 includes a first string of transistors 2021 and a second string of transistors 2020. In this embodiment, the floating input stage 2010, the first string of transistors 2021, and the NOT gate 2030 may be implemented with reference to the floating input stage 1810, the first string of transistors 1821, and the NOT gate 1830 of the above embodiment (FIG. 18), so they are not described here. The second string of transistors 2022 includes a seventh P-type transistor MP7, an eighth P-type transistor MP8, and an eighth N-type transistor M8. A source of the transistor MN8 is grounded, a gate of the transistor MN8 is served as the input node of the second string of transistors 2022, and a drain of the transistor MN8 is served as the output node of the second string of transistors 2022. A drain of the transistor MP8 is coupled to the drain of the transistor MN8, and a gate of the transistor MP8 is coupled to the gate of the transistor MN8. A drain of the transistor MP7 is coupled to the source of the transistor MP8, a gate of the transistor MP7 receives the clock signal CK, and a source of the transistor MP7 is coupled to the supply voltage VDD.

When the clock signal CK is at the high level, the first string of transistors 2021 pre-charges the node N2 to the ground level. Therefore, at the pre-charge period, the transistors MP7 and MP8 are turned off (at this point, the output node of the second string of transistors 2022 is floated). When the clock signal CK is at the low level (i.e. at the evaluation period), the first string of transistors 2021 may immediately decide whether the potential of the node N2 is high level or low level, so the second string of transistors 2022 outputs the input data D as a first output signal Q of the D flip-flop 2000. An output end of the NOT gate 2030 provides a second output signal Qb of the D flip-flop 2000. Therefore, the latch stage 2020 maintains the data D at the pre-charge period, and quickly transmits the date at the evaluation period.

Although the conventional high speed dynamic D flip-flop circuit may be operated at high frequency, because of the connecting method of the circuit, the loss of the short circuit current and the dc current is increased, thus increasing the power consumption. The embodiments of the present invention may be operated in the application environment of low voltage and high speed. To sum up, the D flip-flop of the present invention use the floating inputting manner to input the data at the front floating input stage, so as to reduce the power loss caused by the short circuit current and the dc current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic floating input D flip-flop (DFIDFF), comprising:
   a floating input stage, for transmitting an input data to an output end thereof at a pre-charge period;
   a latch stage, comprising:
      a first string of transistors, having an input node coupled to the output end of the floating input stage, for pre-charging an output node of the first string transistors to a first level at the pre-charge period, and storing the logic status of the input data at the pre-charge period; at an evaluation period, the first string of transistors deciding the output node level of the first string of transistors in accordance with the input data logic status stored therein; and
      a second string of transistors, having an input node coupled to the output node of the first string of transistors and an output node providing a first output signal of the DFIDFF, and at the evaluation period, the second string of transistors deciding the output node level of the second string of transistors in accordance with the logic status of the output node of the first string of transistors; and
   a first NOT gate, wherein an input end of the first NOT gate is coupled to the output node of the second string of transistors, and an output end of the first NOT gate provides a second output signal of the DFIDFF, wherein the floating input stage comprises a switch, a first end of the switch receives the input data, a second end of the switch serves as the output end of the floating input stage, the switch is turned on at the pre-charge period, the switch is turned off at the evaluation period, and the switch comprises:
      a second NOT gate, having an input end receiving a clock signal; and
      an N-type transistor, wherein a source and a drain of the N-type transistor are respectively served as the first end and the second end of the switch, and a gate of the N-type transistor is coupled to the output end of the second NOT gate.

2. The DFIDFF as claimed in claim 1, wherein the switch comprises a P-type transistor, wherein a source and a drain of the P-type transistor are respectively served as the first end and the second end of the switch, and a gate of the P-type transistor receives a clock signal.

3. The DFIDFF as claimed in claim 2, wherein the floating input stage further comprises an N-type transistor, wherein a drain of the N-type transistor is coupled to the second end of the switch, a source of the N-type transistor is grounded, and a gate of the N-type transistor receives an inverse signal of the input data.

4. The DFIDFF as claimed in claim 1, wherein the floating input stage further comprises a P-type transistor, wherein a drain of the P-type transistor is coupled to the second end of the switch, a source of the P-type transistor is coupled to a supply voltage, and a gate of the P-type transistor receives the inverse signal of the input data.

5. The DFIDFF as claimed in claim 1, wherein the first string of transistors comprises:
   a first P-type transistor, having a source coupled to a supply voltage, a gate receiving a clock signal, and a drain served as the output node of the first string of transistors;
   a first N-type transistor, having a drain coupled to the drain of the first P-type transistor, and a gate served as the input node of the first string of transistors; and
   a second N-type transistor, having a drain coupled to the source of the first N-type transistor, a gate receiving the clock signal, and a source grounded.

6. The DFIDFF as claimed in claim 1, wherein the second string of transistors comprises:
   a second P-type transistor, having a source coupled to a supply voltage, a gate served as the input node of the second string of transistors, and a drain served as the output node of the second string of transistors; and
   a third N-type transistor, having a drain coupled to the drain of the second P-type transistor, a gate receiving a clock signal, and a source grounded.

7. The DFIDFF as claimed in claim 1, wherein the second string of transistors comprises:
   a third P-type transistor, having a source coupled to a supply voltage, a gate served as the input node of the second string of transistors, and a drain served as the output node of the second string of transistors;
   a fourth N-type transistor, having a drain coupled to the drain of the third P-type transistor, and a gate coupled to the gate of the third P-type transistor; and
   a fifth N-type transistor, having a drain coupled to the source of the fourth N-type transistor, a gate receiving a clock signal, and a source grounded.

8. The DFIDFF as claimed in claim 1, wherein the first string of transistors comprises:
   a fourth P-type transistor, having a source coupled to a supply voltage, and a gate receiving a clock signal;
   a fifth P-type transistor, having a source coupled to the drain of the fourth P-type transistor, a gate served as the input node of the first string of transistors, and a drain served as the output node of the first string of transistors; and a sixth N-type transistor, having a drain coupled to the drain of the fifth P-type transistor, a gate receiving the clock signal, and a source grounded.

9. The DFIDFF as claimed in claim 1, wherein the second string of transistors comprises;
   a sixth P-type transistor, having a source coupled to a supply voltage, a gate receiving a clock signal, and a drain served as the output node of the second string of transistors; and
   a seventh N-type transistor, having a drain coupled to the drain of the sixth P-type transistor, a source grounded, and a gate served as the input node of the second string of transistors.

10. The DFIDFF as claimed in claim 1, wherein the second string of transistors comprises:
    a seventh P-type transistor, having a source coupled to a supply voltage, and a gate receiving a clock signal;
    an eighth P-type transistor, having a source coupled to a drain of the seventh P-type transistor, a gate served as the input node of the second string of transistors, and a drain served as the output node of the second string of transistors; and
    an eighth N-type transistor, having a drain coupled to the drain of the eighth P-type transistor, a gate coupled to the gate of the eighth P-type transistor, and a source grounded.

11. A dynamic floating input D flip-flop (DFIDFF), comprising:
    a floating input stage, for transmitting an input data to an output end thereof at a pre-charge period; and
    a latch stage, comprising:
       a first string of transistors, having an input node coupled to the output end of the floating input stage, for pre-charging an output node of the first string transistors to a first level at the pre-charge period, and storing the logic status of the input data at the pre-charge period; at an evaluation period, the first string of transistors deciding the output node level of the first string of transistors in accordance with the input data logic status stored therein; and
       a second string of transistors, having an input node coupled to the output node of the first string of transistors and an output node providing a first output signal of the DFIDFF, and at the evaluation period, the second string of transistors deciding the output node level of the second string of transistors in accordance with the logic status of the output node of the first string of transistors; and
    a first NOT gate, wherein an input end of the first NOT gate is coupled to the output node of the second string of transistors, and an output end of the first NOT gate provides a second output signal of the DFIDFF,
    wherein the floating input stage comprises a switch, a first end of the switch receives the input data, a second end of the switch serves as the output end of the floating input stage, the switch is turned on at the pre-charge period, the switch is turned off at the evaluation period, and the switch comprises:
       a second NOT gate, having an input end receiving a clock signal; and
       a transmission gate, having a first end and a second end respectively served as the first end and the second end of the switch, wherein a first gate of the transmission gate receives the clock signal, and a second gate of the transmission gate is coupled to the output end of the second NOT gate.

12. The DFIDFF as claimed in claim 11, wherein the first string of transistors comprises:
    a first P-type transistor, having a source coupled to a supply voltage, a gate receiving a clock signal, and a drain served as the output node of the first string of transistors;
    a first N-type transistor, having a drain coupled to the drain of the first P-type transistor, and a gate served as the input node of the first string of transistors; and
    a second N-type transistor, having a drain coupled to the source of the first N-type transistor, a gate receiving the clock signal, and a source grounded.

13. The DFIDFF as claimed in claim 11, wherein the second string of transistors comprises:
    a second P-type transistor, having a source coupled to a supply voltage, a gate served as the input node of the second string of transistors, and a drain served as the output node of the second string of transistors; and
    a third N-type transistor, having a drain coupled to the drain of the second P-type transistor, a gate receiving a clock signal, and a source grounded.

14. The DFIDFF as claimed in claim 11, wherein the second string of transistors comprises:
    a third P-type transistor, having a source coupled to a supply voltage, a gate served as the input node of the second string of transistors, and a drain served as the output node of the second string of transistors;
    a fourth N-type transistor, having a drain coupled to the drain of the third P-type transistor, and a gate coupled to the gate of the third P-type transistor; and
    a fifth N-type transistor, having a drain coupled to the source of the fourth N-type transistor, a gate receiving a clock signal, and a source grounded.

15. The DFIDFF as claimed in claim 11, wherein the first string of transistors comprises:
    a fourth P-type transistor, having a source coupled to a supply voltage, and a gate receiving a clock signal;
    a fifth P-type transistor, having a source coupled to the drain of the fourth P-type transistor, a gate served as the input node of the first string of transistors, and a drain served as the output node of the first string of transistors; and
    a sixth N-type transistor, having a drain coupled to the drain of the fifth P-type transistor, a gate receiving the clock signal, and a source grounded.

16. The DFIDFF as claimed in claim 11, wherein the second string of transistors comprises:
    a sixth P-type transistor, having a source coupled to a supply voltage, a gate receiving a clock signal, and a drain served as the output node of the second string of transistors; and
    a seventh N-type transistor, having a drain coupled to the drain of the sixth P-type transistor, a source grounded, and a gate served as the input node of the second string of transistors.

17. The DFIDFF as claimed in claim 11, wherein the second string of transistors comprises:
    a seventh P-type transistor, having a source coupled to a supply voltage, and a gate receiving a clock signal;
    an eighth P-type transistor, having a source coupled to a drain of the seventh P-type transistor, a gate served as the input node of the second string of transistors, and a drain served as the output node of the second string of transistors; and
    an eighth N-type transistor, having a drain coupled to the drain of the eighth P-type transistor, a gate coupled to the gate of the eighth P-type transistor, and a source grounded.

18. A dynamic floating input D flip-flop (DFIDFF), comprising:
a floating input stage, for transmitting an input data to an output end thereof at a pre-charge period; and
a latch stage, comprising:
a first string of transistors, having an input node coupled to the output end of the floating input stage, for pre-charging an output node of the first string transistors to a first level at the pre-charge period, and storing the logic status of the input data at the pre-charge period; at an evaluation period, the first string of transistors deciding the output node level of the first string of transistors in accordance with the input data logic status stored therein; and
a second string of transistors, having an input node coupled to the output node of the first string of transistors and an output node providing a first output signal of the DFIDFF, and at the evaluation period, the second string of transistors deciding the output node level of the second string of transistors in accordance with the logic status of the output node of the first string of transistors; and
a first NOT gate, wherein an input end of the first NOT gate is coupled to the output node of the second string of transistors, and an output end of the first NOT gate provides a second output signal of the DFIDFF,
wherein the floating input stage comprises a switch, a first end of the switch receives the input data, a second end of the switch serves as the output end of the floating input stage, the switch is turned on at the pre-charge period, the switch is turned off at the evaluation period, and the switch comprises:
a second NOT gate, having an input end receiving a clock signal; and
a P-type transistor, wherein a source and a drain of the P-type transistor are respectively served as the first end and the second end of the switch, and a gate of the P-type transistor is coupled to the output end of the second NOT gate.

19. The DFIDFF as claimed in claim 18, wherein the switch comprises an N-type transistor, wherein a source and a drain of the N-type transistor are respectively served as the first end and the second end of the switch, and a gate of the N-type transistor receives a clock signal.

20. The DFIDFF as claimed in claim 19, wherein the floating input stage further comprises a P-type transistor, wherein a drain of the P-type transistor is coupled to the second end of the switch, a source of the P-type transistor is coupled to a supply voltage, and a gate of the P-type transistor receives the inverse signal of the input data.

21. The DFTDFF as claimed in claim 18, wherein the floating input stage further comprises an N-type transistor, wherein a drain of the N-type transistor is coupled to the second end of the switch, a source of the N-type transistor is grounded, and a gate of the N-type transistor receives the inverse signal of the input data.

22. The DFIDFF as claimed in claim 18, wherein the first string of transistors comprises:
a first P-type transistor, having a source coupled to a supply voltage, a gate receiving a clock signal, and a drain served as the output node of the first string of transistors;
a first N-type transistor, having a drain coupled to the drain of the first P-type transistor, and a gate served as the input node of the first string of transistors; and
a second N-type transistor, having a drain coupled to the source of the first N-type transistor, a gate receiving the clock signal, and a source grounded.

23. The DFIDFF as claimed in claim 18, wherein the second string of transistors comprises:
a second P-type transistor, having a source coupled to a supply voltage, a gate served as the input node of the second string of transistors, and a drain served as the output node of the second string of transistors; and
a third N-type transistor, having a drain coupled to the drain of the second P-type transistor, a gate receiving a clock signal, and a source grounded.

24. The DFIDFF as claimed in claim 18, wherein the second string of transistors comprises:
a third P-type transistor, having a source coupled to a supply voltage, a gate served as the input node of the second string of transistors, and a drain served as the output node of the second string of transistors;
a fourth N-type transistor, having a drain coupled to the drain of the third P-type transistor, and a gate coupled to the gate of the third P-type transistor; and
a fifth N-type transistor, having a drain coupled to the source of the fourth N-type transistor, a gate receiving a clock signal, and a source grounded.

25. The DFIDFF as claimed in claim 18, wherein the first string of transistors comprises:
a fourth P-type transistor, having a source coupled to a supply voltage, and a gate receiving a clock signal;
a fifth P-type transistor, having a source coupled to the drain of the fourth P-type transistor, a gate served as the input node of the first string of transistors, and a drain served as the output node of the first string of transistors; and
a sixth N-type transistor, having a drain coupled to the drain of the fifth P-type transistor, a gate receiving the clock signal, and a source grounded.

26. The DFIDFF as claimed in claim 18, wherein the second string of transistors comprises:
a sixth P-type transistor, having a source coupled to a supply voltage, a gate receiving a clock signal, and a drain served as the output node of the second string of transistors; and
a seventh N-type transistor, having a drain coupled to the drain of the sixth P-type transistor, a source grounded, and a gate served as the input node of the second string of transistors.

27. The DFIDFF as claimed in claim 18, wherein the second string of transistors comprises:
a seventh P-type transistor, having a source coupled to a supply voltage, and a gate receiving a clock signal;
an eighth P-type transistor, having a source coupled to a drain of the seventh P-type transistor, a gate served as the input node of the second string of transistors, and a drain served as the output node of the second string of transistors; and
an eighth N-type transistor, having a drain coupled to the drain of the eighth P-type transistor, a gate coupled to the gate of the eighth P-type transistor, and a source grounded.

* * * * *